United States Patent
Lin et al.

(10) Patent No.: US 6,333,277 B1
(45) Date of Patent: Dec. 25, 2001

(54) METHOD FOR REDUCING NON-HOMOGENOUS DENSITY DURING FORMING PROCESS OF BOROPHOSPHOSILICATE GLASS LAYER

(75) Inventors: Keng-Chu Lin, Ping-Tung; Hsiao-Wen Lee, Hsin-Chu; Hou-Hung Chou, Taipei; Yi-Wen Chen, Hsin-Chu, all of (TW)

(73) Assignees: Vanguard International Semiconductor Corporation (TW); Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/725,069

(22) Filed: Nov. 29, 2000

(51) Int. Cl.[7] .................... H01L 21/31; H01L 21/469
(52) U.S. Cl. ........................................ 438/758; 438/513
(58) Field of Search .................... 438/513, 646, 438/758, 762, 765, 767, 770, 772, 774, 755, 777, 779, 780, 789, 790, 793, 794, 905, 906

(56) References Cited

U.S. PATENT DOCUMENTS

| | | | |
|---|---|---|---|
| 5,862,057 | * 1/1999 | Xia et al. | 364/488 |
| 5,935,334 | * 8/1999 | Fong et al. | 118/723 |
| 6,114,216 | * 9/2000 | Yieh et al. | 438/424 |
| 6,159,870 | * 12/2000 | Chakravarti et al. | 438/784 |

* cited by examiner

Primary Examiner—David Nelms
Assistant Examiner—David Nhu

(57) ABSTRACT

A method for reducing non-homogenous density during forming process of borophosphosilicate glass layer, at least includes following basic steps: delivers an oxygen gas through a gas pipeline into a chamber, and also delivers a tetraethyl-orthosilicate gas, a tri-ethyl-borate gas and a tri-ethyl-phosphate gas through a reactant pipeline into a bypass pipeline to let the chamber is filled by only the oxygen gas, wherein the bypass pipeline is adjacent to the chamber; whenever flow of the oxygen gas in both the gas pipeline and the chamber is stable and flow of both the tetraethyl-orthosilicate gas, the tri-ethyl-borate gas and the tri-ethyl-phosphate gas in the reactant pipeline also is stable, closes the reactant pipeline and then delivers the tetraethyl-orthosilicate gas, the tri-ethyl-borate gas and the tri-ethyl-phosphate gas into the chamber; and performs at least a process to form a borophosphosilicate glass layer on a wafer that locates inside the chamber. Obviously, one essential characteristic of the method is reactants are delivered into chamber after flow of reactants are stable, and then non-homogenous density of borophosphosilicate glass layer that induced by unstable flow is effectively prevented.

18 Claims, 6 Drawing Sheets

|  | t<tc | t>tc |
|---|---|---|
| Bypass pipeline | Reactants exist | Reactants not exist |
| Chamber | Reactants not exist | Reactants exist |

METHOD FOR REDUCING NON-HOMOGENOUS DENSITY DURING FORMING PROCESS OF BOROPHOSPHOSILICATE GLASS LAYER

BACKGROUND OF THE INVENTION

1. Field of the Invention

The present invention relates to a method for forming homogenous density borophosphosilicate glass layer, and particular relates to a method for controlling ratio of component elements of borophosphosilicate glass layer by controlling delivered timing of reactants.

2. Description of the Prior Art

In semiconductor fabrication process, silicon dioxide is a broadly used dielectric material, no matter is used to be passivation layer, barrier layer, capacitor or other purpose. Further, except directly use thermal oxidation to form silicon dioxide layer on a silicon substrate, silicon dioxide usually is formed by deposition method.

Reactants of silicon dioxide of conventional deposition method usually are silane or tetraethyl-orthosilicate (TEOS). Because step coverage of silicon dioxide formed by silane is worse and both wafer and chamber is easy to be polluted during reacting process of silane, and because step coverage of silicon dioxide formed by tetraethyl-orthosilicate is batter, silane is gradationally replaced by tetraethyl-orthosilicate.

Besides, owing to critical dimensional of semiconductor device is continuously shrunk, deposited silicon dioxide layer usual faces some disadvantages such as gap fill is bad or surface is not smooth, and then it is necessary to perform thermal flow process after depositing process is finished to let all gaps are filled and surface is more smooth. However, because glass translation temperature of silicon dioxide formed by tetraethyl-orthosilicate usually is larger than 1000° C., thermal flow process usually come in with thermal diffusion that will degrade quality of semiconductor device. Thus, to reduce the glass translation temperature, one effective way is doping impurities, such as boron or phosphorous, into silicon dioxide to reduce the glass translation temperature, and the most popular way is doping both boron and phosphorous into silicide dioxide at the same, which is named as borophosphosilicate glass. Owing to glass translation temperature of borophosphosilicate glass is about from 850° C. to 950° C. and mechanical stress of borophosphosilicate glass is less than mechanical stress of pure silicon dioxide, borophosphosilicate gradationally become most popular material for metallization process.

Further, because step coverage of silane is bad than tetraethyl-orthosilicate and reacting process of silane requires virulent reactants such as $B_2F_6$ and $PH_3$, forming process of borophosphosilicate usually uses organic compounds, such as tri-ethyl-borate (TEB) and tri-ethyl-phosphate (TEPO), as reactants, and use ozone to reduce required reacting temperature during reacting process.

Because organic compounds, such as TEOS, TEB and TEOS, usually are liquid in room temperature, organic compounds can not be directly delivered into chamber. As usual, popular methods at least includes heats container of liquid organic compound to increase saturated vapor pressure and delivers carrier gas into the container to increase gaseous pressure of liquid organic compound. Herein, flow of the gaseous organic compound can be controlled by adjusting temperature of container, adjusting flow of carrier gas (by application of mass flow meter) or adjusting flow of liquid organic compound (by application of liquid flow meter) and so on. Obviously, because property of borophosphosilicate is strongly affected by ratio of boron and phosphor, how to exactly control flow of organic compounds is a master key of borophosphosilicate fabrication.

Further, because these organic compounds are delivered into chamber after required reacting environment has been established, flow of these organic compounds should be instantly changed from zero to required account on paper. However, owing to limitation of practical ability of machines. Real relation between flow and time usually is not stable at incipient period and is stable after a buffer period, as shown in FIG. 1A and FIG. 1B. In this way, before borophosphosilicate is formed and even in incipient period of depositing process, ratio between all used organic compounds is not fixed and following byeffects are unavoidable: first, density of boron/phosphor is different to default density and then glass translation temperature of bottom part of borophosphosilicate glass layer is different to glass translation temperature of bulk part of borophosphosilicate glass layer; second, account of TEB and/or TEPO is too much to be totally used, and then part of TEB and/or TEPO exists between substrate and bottom part of borophosphosilicate glass layer as liquid residual.

Significantly, because result of thermal flow process strongly depends on glass translation temperature, whenever glass translation temperature of bottom part of borophosphosilicate glass layer is higher than glass translation temperature of bulk part of borophosphosilicate glass layer, as FIG. 1C shows, borophosphosilicate glass layer 12 can not totally fills gaps between semiconductor structures 11 on substrate 10, and then voids 13 is appeared. Moreover, as FIG. 1D shows, because sequential processes after borophosphosilicate 12 is formed at least includes etching process and cleaning process, whenever etching rate of bottom part of borophosphosilicate glass layer 12 is higher than etching rate of bulk part of borophosphosilicate glass layer 12, undercuts 14 will be happen. Obviously, if neighboring undercuts is too close, not only structural stability of borophosphosilicate glass layer 12 is degraded but also neighboring undercuts 14 may be short whenever metal 15 is filled into these undercuts 14.

Furthermore, as FIG. 1E shows, whenever liquid organic compounds 16, TEB and/or TEPO, remains between substrate 10 and bottom part of borophosphosilicate glass layer 12, adhesion between substrate 10 and bottom part of borophosphosilicate glass layer 12 will be degraded, and than borophosphosilicate glass layer 12 may faces following disadvantages: peeling and lifting, as FIG. 1F shows.

According to previous discussion, current fabrication process of borophosphosilicate glass layer can not effectively prevent non-homogenous density of boron and/or phosphor, and then some bad byeffects, such as void, undercut and degraded adhesion, are unavoidable. In this way, in order to fully produce result of good step coverage and low glass translation temperature of borophosphosilicate glass, it is desired to develop a method for forming homogenous density Borophosphosilicate glass layer.

SUMMARY OF THE INVENTION

One principal object of the invention is to present a method for reducing non-homogenous density of boron and/or phosphor during fabrication process of borophosphosilicate glass layer.

Another main object of this invention is to provide a fabrication process of borophosphosilicate that effectively prevent byeffects such as undercut, void and degraded adhesion.

Still an object of this invention is to propose a method that effectively control flow of reactants into a chamber without requirement of obviously modified current deposition system.

On the whole, method present by the invention at least includes following basic steps: delivers an oxygen gas through a gas pipeline into a chamber, and also delivers a tetraethyl-orthosilicate gas, tri-ethyl-borate gas and a tri-ethyl-phosphate gas through a reactant pipeline into a bypass pipeline to let the chamber is filled by only the oxygen gas, wherein the bypass pipeline is adjacent to the chamber; whenever flow of the oxygen gas in both the gas pipeline and the chamber is stable and flow of both the tetraethyl-orthosilicate gas, the tri-ethyl-borate gas and the tri-ethyl-phosphate gas in the reactant pipeline also is stable, closes the reactant pipeline and then delivers the tetraethyl-orthosilicate gas, the tri-ethyl-borate gas and the tri-ethyl-phosphate gas into the chamber; and performs at least a process to form a borophosphosilicate glass layer on a wafer that locates inside the chamber. Obviously, one essential characteristic of the method is reactants are delivered into chamber after flow of reactants are stable, and then non-homogenous density of borophosphosilicate glass layer that induced by unstable flow is effectively prevented.

Furthermore, though background of the invention is focused on non-homogenous density of boron and/or phosphor of borophosphosilicate, owing to contents of the invention especially emphasizes non-homogenous density induced by unstable flow of correlative reactants, it is natural that the invention can be applied by any semiconductor fabrication that flow of reactants, especially initial flow, is unstable.

BRIEF DESCRIPTION OF THE DRAWINGS

The foregoing versions and many of the attendant advantages of this invention will become more readily appreciated as the same become better understood by reference to the following detailed description, when taken in conjunction with the accompanying drawings, wherein.

DESCRIPTION OF THE PREFERRED EMBODIMENT

Figure 1A:
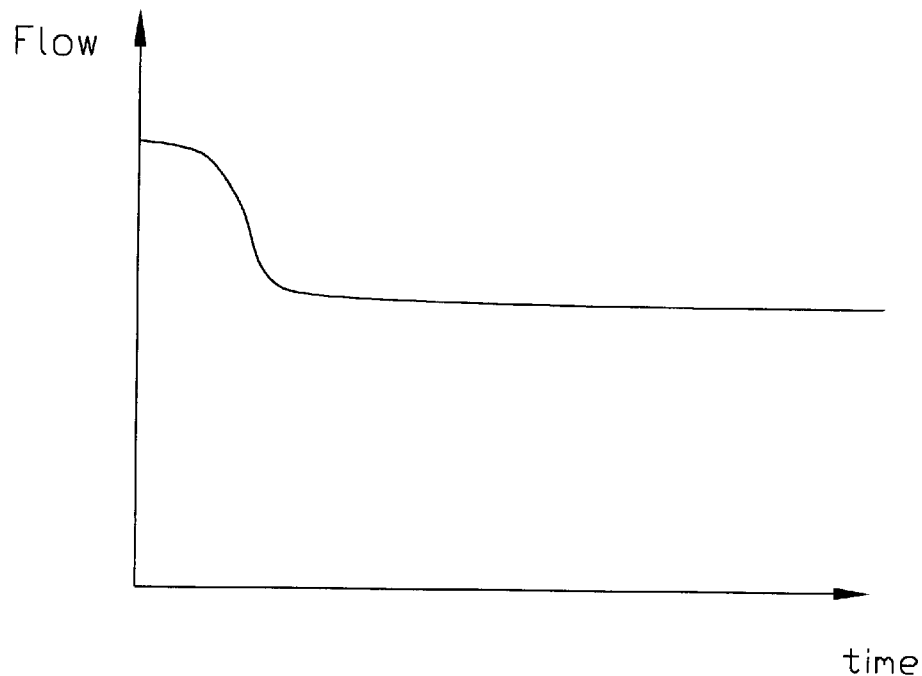
FIG. 1A and FIG. 1B are two often seen unstable initial relations between flow and time.
Figure 1B:
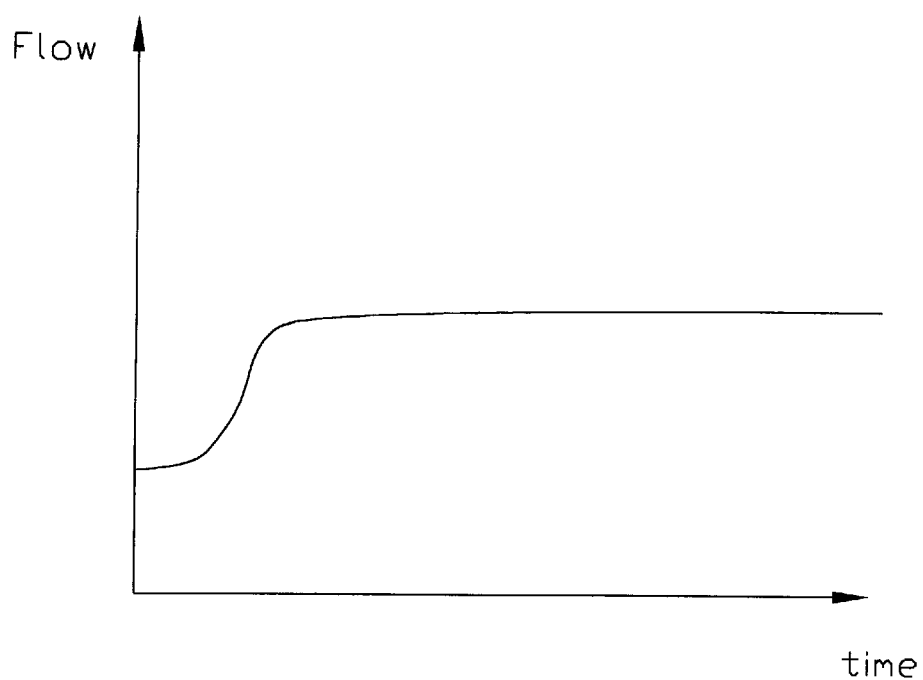
Figure 1C:
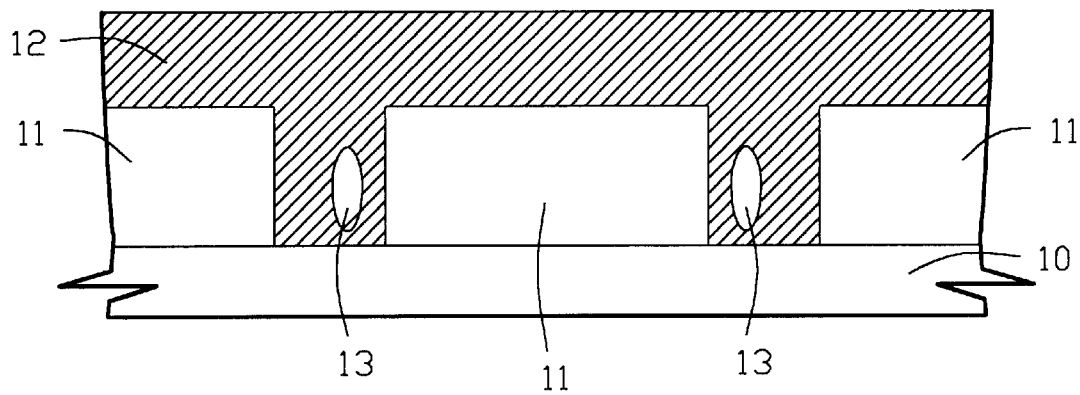
FIG. 1C to FIG. 1E are several disadvantages that induced by unstable flow of reactants during fabrication process of borophosphosilicate.
Figure 1D:
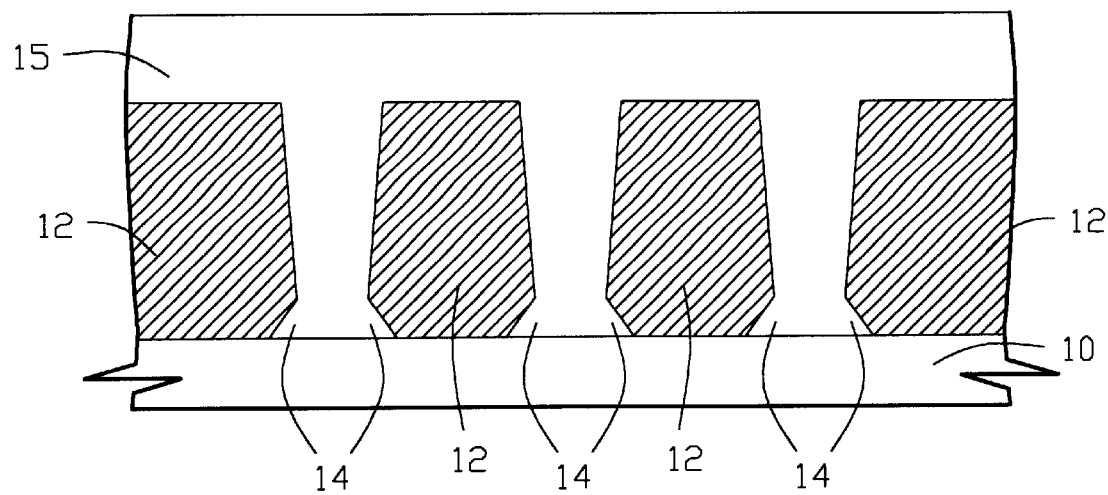
Figure 1E:
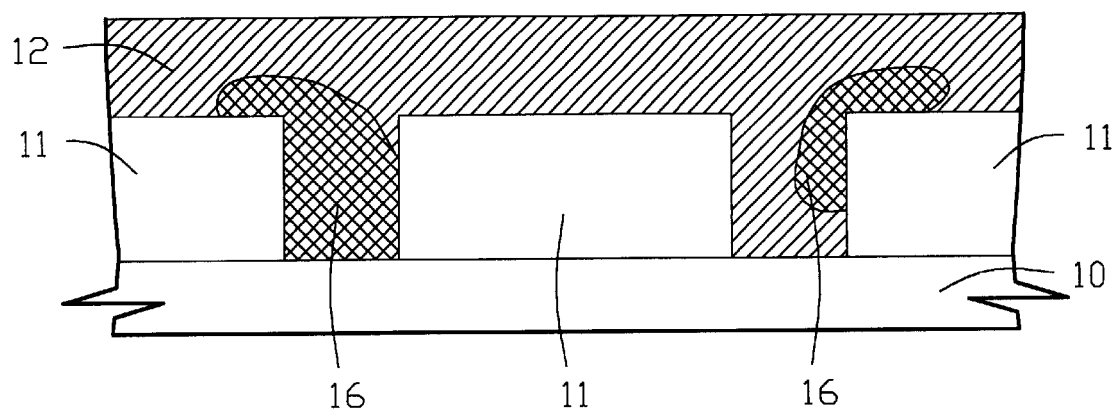
Figure 1F:
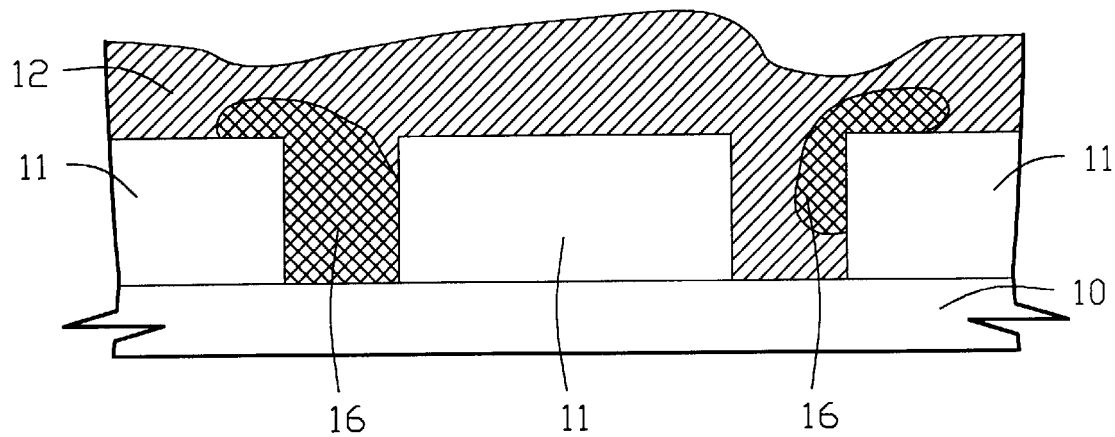

Aims at unstable initial flow of reactants, such as FIG. 1A and FIG. 1B shows, an intuitive solution is to modify correlative semiconductor fabrication devices to exactly control flow of each reactant, particularly to exactly control flow of reactants that delivered into the chamber. However, because that modification of semiconductor fabrication devices unavoidably comes up against cost, maintenance and modified fabrication process, inventors of the invention point out another entrance for solving the problem: key point is whether all reactants enter chamber with a stable flow but is not whether flow of any reactant is thoroughly stable from reactant source through pipeline and chamber to recycle station.

Figure 2A:
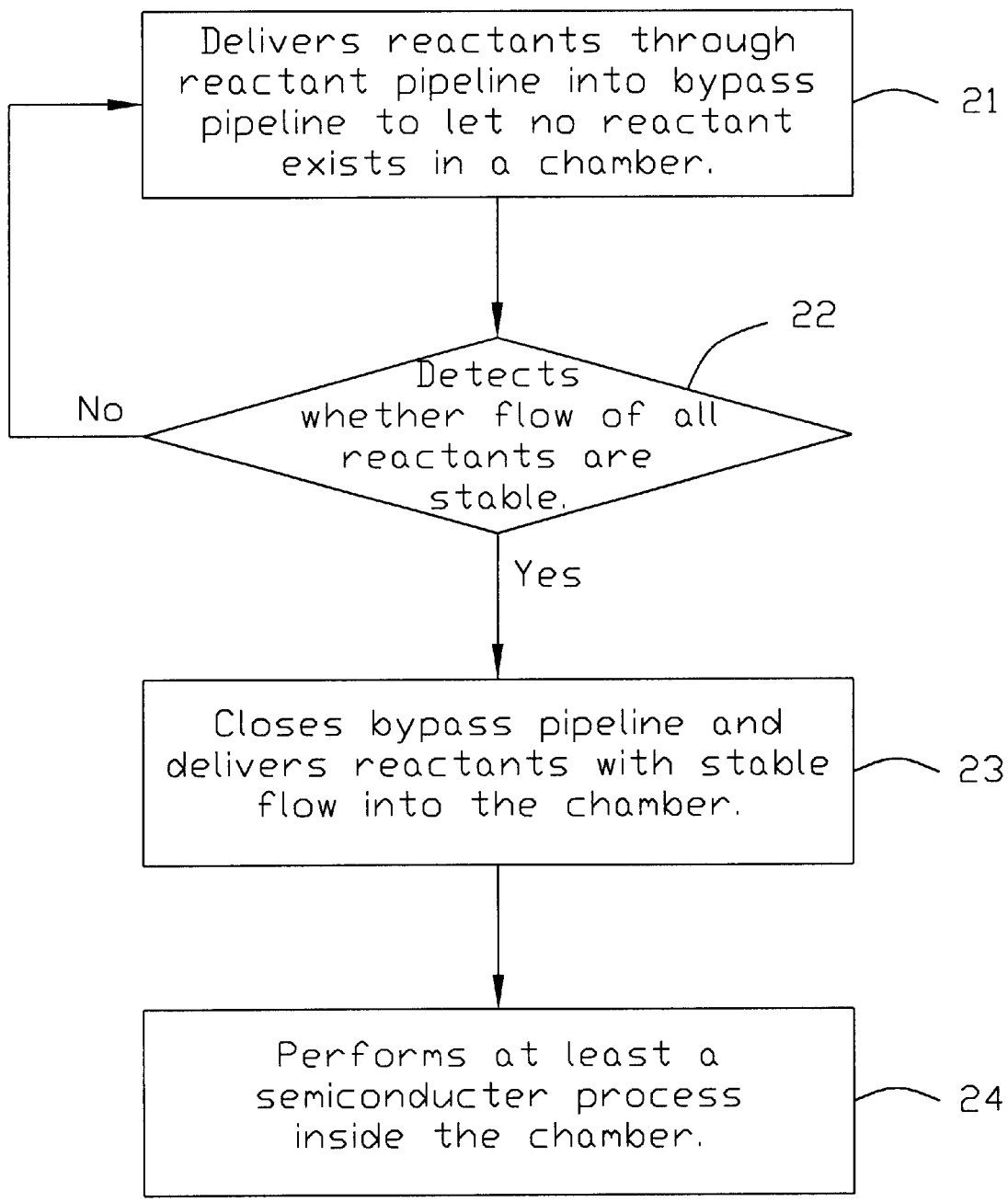
FIG. 2A is a basic flow-chart of the invention.

FIG. 2A is a basic flow-chart of the invention: First, as prepare block 21 show, delivers reactants through reactant pipeline into bypass pipeline, which is neighboring to a chamber, to let no reactant exists in the chamber, whereby reactants can be gaseous material of liquid material that propagated by carrier gas. Second, as detect block 22 shows, detects whether flow or each reactant in both reactant pipeline and bypass pipeline has been stable. If answer of detect block 22 is no then continuously perform prepare block 21, otherwise as stable block 23 shows, closes bypass pipeline and delivers reactants with stable flow into the chamber. Finally, as react block 24 shows, performs at least a semiconductor process, such as deposition, inside the chamber.

It should be emphasized that though FIG. 1A and FIG. 1B only focus on unstable flow of TEOS, TEB and TEPO, because almost any fluid reactant will meet problem that initial flow is unstable, application of the invention is not limited in only to solve unstable flow of organic compounds, such as TEOS, TEB and TEPO, and can be used to treat any liquid reactants.

Figures 2B, 2C:
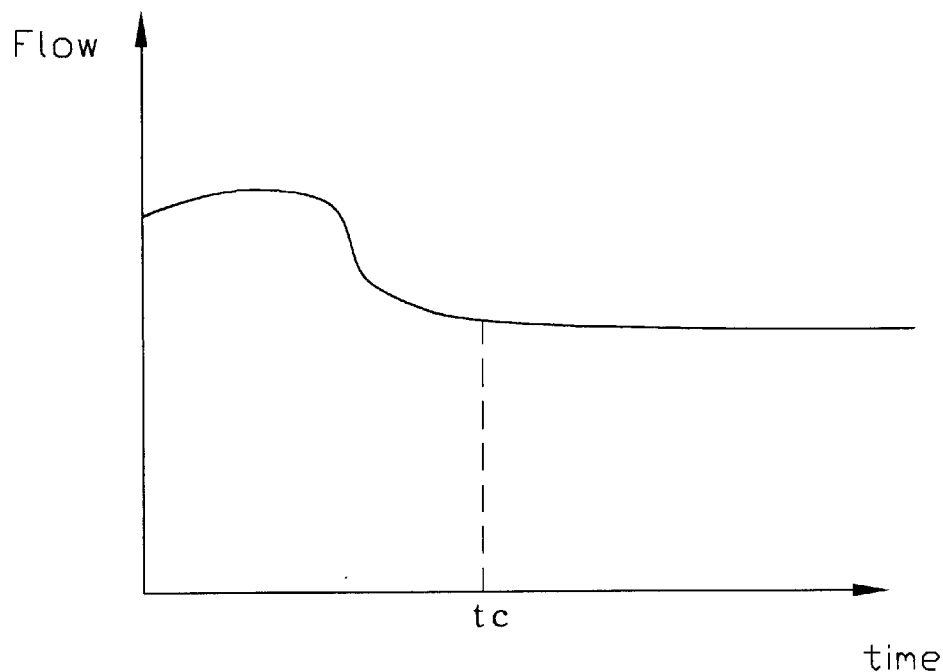
FIG. 2B and FIG. 2C are sketch maps of the invention.

Conception of the invention can be further explained by referring to both FIG. 2B and FIG. 2C. As shown in FIG. 2B, flow of reactant flows inside semiconductor fabrication device can be divided into unstable flow stage (t<tc) and stable flow stage (t>tc). Herein, tc is parameter that depends on practical configuration and operation of semiconductor fabrication device, and flow-time relation shown in FIG. 2B only is an example and any flow-time relation that is stable after an unstable period is object of the invention. As shown in FIG. 2C, reactants flow through bypass pipeline and is not delivered into reactor whenever t<tc, and reactant with stable flow is delivered into chamber whenever t>tc. Obviously, because flow of each reactant that delivered into chamber has been stable, non-homogenous density can be effective prevented, especially when some reactants is difficulty to be pumped and is tend to accumulate on wafer.

Furthermore, if more than one reactant is required by semiconductor process that will be performed in the chamber, all reactants are delivered into the chamber at same time when flow of each reactant has been stable. Besides, because function of bypass pipeline only is propagating reactants to avoid reactants are delivered into the chamber before flow of reactants are stable, bypass pipeline can be provided by maintenance pipeline, such as pipeline for pumping of semiconductor fabrication device, or be provided by new pipeline which is particularly established for delivering reactants.

Moreover, to reduce instability when the flow of reactants is changed from the reactant pipelines into the chamber, not only must the valve have high switch efficiency, but also, the interface between the bypass pipeline and the reactant pipeline should be closed to interface the reactant pipeline with the chamber as soon as possible. Moreover, to ensure that the environment in the chamber is suitable for performing semiconductor processes when reactants are delivered into the chamber, it is beneficial to fill the chamber with background gas to ensure that the required environment is established before the reactants are delivered. Herein, available varieties of background gas have oxygen, nitrogen, inert gas or a gaseous reactant (one kind of gaseous reactant that will not react when several reactants are required).

Figure 3:
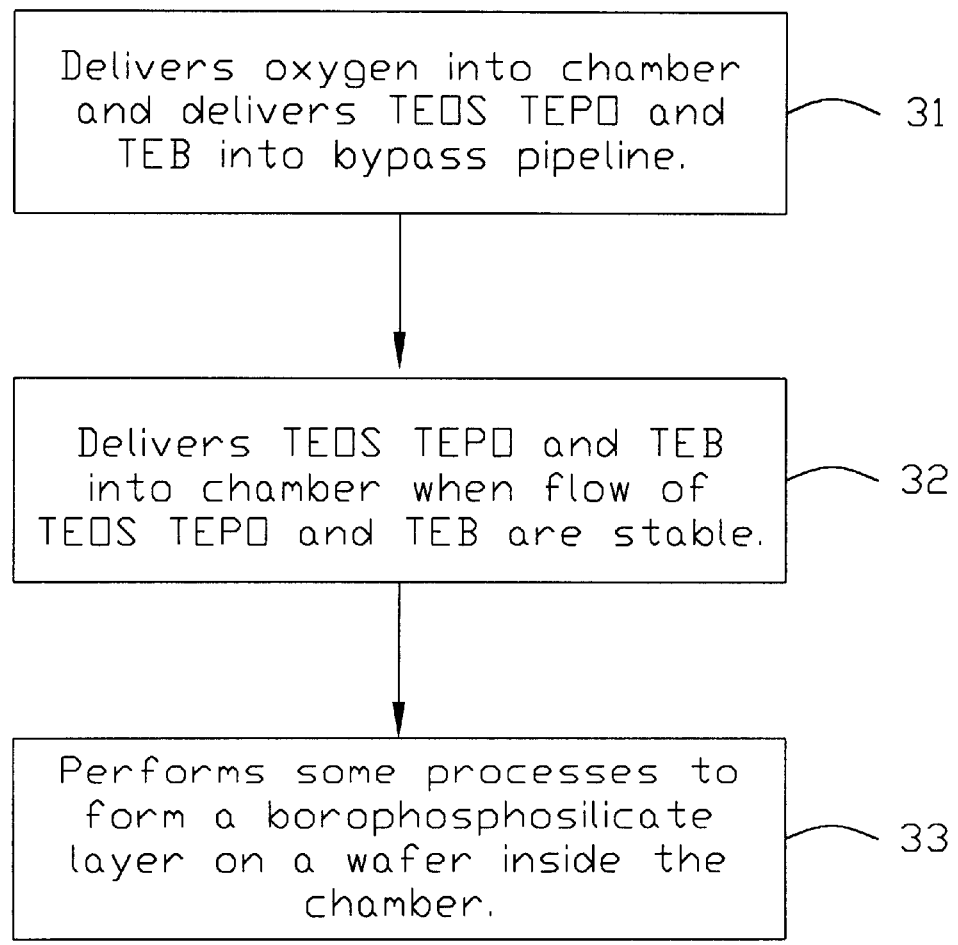
FIG. 3 is a flow-chart about essential steps of a preferred embodiment of the invention.

Referring to FIG. 3A, a practical preferred embodiment discloses how to use the invention for forming homogenous density borophosphosilicate glass layer on wafer that locates in a chamber.

First, as separate block 31 shows, an oxygen gas is delivered through a gas pipeline into a chamber, and there is also delivered tetraethyl-orthosilicate gas, a tri-ethyl-borate gas and a tri-ethyl-phosphate gas through a reactant pipeline into a bypass pipeline, which usually is adjacent to the chamber, to let the chamber be filled only by the oxygen gas. Moreover, because TEPO, TEB and TEOS are liquid compounds at room temperature and room pressure, a carrier gas, such as nitrogen and an inert gas, are used to propagate these reactants into the chamber and then an unavoidable disadvantage occurs where that residual liquid TEOS, residual liquid TEB, residual liquid TEPO may not be pumped away and remains on the wafer.

Then, as change path block 32 shows, whenever flow of the oxygen gas in both the gas pipeline and the chamber is stable and flow of both the tetraethyl-orthosilicate gas, the tri-ethyl-borate gas and the tri-ethyl-phosphate gas in the reactant pipeline also is stable, closes the reactant pipeline and then delivers the tetraethyl-orthosilicate gas, the tri-ethyl-borate gas and the tri-ethyl-phosphate gas into the chamber. Further, it should be emphasized that one main key point of the invention is that any reactant is delivered into the chamber after flow of the reactant has been stable, and whether all kinds of reactants are delivered into the chamber at the same time or not is not main key point of the invention. In fact, it is decided in accordance with whether byeffects, such as accumulation of reactant, are happened.

Finally, as formation block 33 shows, performs at least a process, such as heating process, to form a borophosphosilicate glass layer on a wafer that locates inside the chamber. Whereby, borophosphosilicate glass layer usually is formed by chemical vapor deposition, weight percentage of boron in said borophosphosilicate glass layer is about from 1% to 4%, weight percentage of phosphor in said borophosphosilicate glass layer is about from 4% to 6%, and then glass translation temperature of said borophosphosilicate glass layer is about from 850° C. to 950° C. Further, in order to reduce required reacting temperature when tetraethyl-orthosilicate gas, tri-ethyl-borate gas and tri-ethyl-phosphate gas are all delivered into the chamber, the method comprises replacing the oxygen gas by an ozone gas.

Obviously, because flow of anyone of TEOS, TEPO and TEB has been stable before it is delivered into the chamber, ration of reactants can be exactly controlled since reactants are delivered into the chamber. Thus, no reactant will be residual and density of boron and/or phosphor is homogenous among whole structure of borophosphosilicate glass layer. In other words, conventional disadvantages of well-known technology, such as under cut, void and degraded adhesion, can be properly prevented.

Although specific embodiment has been illustrated and described, it will be obvious to those skilled in the art that various modifications may be made without departing from what is intended to be limited solely by the appended claims.

What is claimed is:

1. A method for reducing non-homogenous density during forming process of borophosphosilicate glass layer, comprising:

delivering an oxygen gas through a gas pipeline into a chamber, and delivering a tetraethyl-orthosilicate gas, a tri-ethyl-borate gas and a tri-ethyl-phosphate gas through a reactant pipeline into a bypass pipeline to let said chamber is filled by only said oxygen gas, wherein said bypass pipeline is adjacent to said chamber;

closing said reactant pipeline and delivering said tetraethyl-orthosilicate gas, said tri-ethyl-borate gas and said tri-ethyl-phosphate gas into said chamber, whenever flow of said oxygen gas in both said gas pipeline and said chamber is stable and flow of both said tetraethyl-orthosilicate gas, said tri-ethyl-borate gas and said tri-ethyl-phosphate gas in said reactant pipeline also is stable; and performing at least a process to form a borophosphosilicate glass layer on a wafer that locates inside said chamber.

2. The apparatus according to claim 1, wherein said tetraethyl-orthosilicate gas is propagated by a first carrier gas.

3. The method according to claim 2, wherein said first carrier gas is nitrogen gas.

4. The method according to claim 1, wherein said tri-ethyl-borate gas is propagated by a second carrier gas.

5. The method according to claim 4, wherein said second carrier gas is inert gas.

6. The method according to claim 1, wherein said tri-ethyl-phosphate gas is propagated by a third carrier gas.

7. The method according to claim 6, wherein said third carrier gas is selected from the group consisting of nitrogen gas and inert gas.

8. The method according to claim 1, wherein said borophosphosilicate glass layer is formed by a chemical vapor deposition process.

9. The method according to claim 1, wherein weight percentage of boron in said borophosphosilicate glass layer is about from 1% to 4%.

10. The method according to claim 1, wherein weight percentage of phosphor in said borophosphosilicate glass layer is about from 4% to 6%.

11. The method according to claim 1, wherein glass translation temperature of said borophosphosilicate glass layer is about from 850° C. to 950° C.

12. The method according to claim 1, further comprises replacing said oxygen gas by an ozone gas to reduce required reacting temperature when said tetraethyl-orthosilicate gas, said tri-ethyl-borate gas and said tri-ethyl-phosphate gas are delivered into said chamber.

13. A method for preventing unstable initial flow of a reactant that delivered into a chamber, comprising:

delivering said reactant through a pipeline into a bypass pipeline to avoid said reactant is delivered into said chamber, wherein said bypass pipeline is closed to said chamber; and closing said bypass pipeline and delivering said reactant into said chamber whenever flow of said reactant inside both said reactant pipeline and said bypass pipeline is stable.

14. The method according to claim 13, wherein said reactant is a gaseous material.

15. The method according to claim 13, wherein said reactant is a liquid material that propagated by a carrier gas.

16. The method according to claim 15, wherein said carrier gas is selected from the group consisting of nitrogen gas and inert gas.

17. The method according to claim 13, further comprises inputting a gas into said chamber to ensure a required environment is established before said reactant is delivered into said chamber.

18. The method according to claim 13, wherein said gas is selected from the group consisting of oxygen gas, nitrogen gas, inert gas and gaseous reactant.

* * * * *